(12) United States Patent
Kim et al.

(10) Patent No.: US 11,502,279 B2
(45) Date of Patent: Nov. 15, 2022

(54) DISPLAY MODULE

(71) Applicant: Samsung Display Co., Ltd., Yongin-Si (KR)

(72) Inventors: Soodong Kim, Hwaseong-si (KR); Jang Wi Ryu, Seoul (KR)

(73) Assignee: Samsung Display Co., Ltd.

(*) Notice: Subject to any disclaimer, the term of this patent is extended or adjusted under 35 U.S.C. 154(b) by 188 days.

(21) Appl. No.: 16/845,252

(22) Filed: Apr. 10, 2020

(65) Prior Publication Data

US 2020/0373513 A1 Nov. 26, 2020

(30) Foreign Application Priority Data

May 24, 2019 (KR) .................. 10-2019-0061376

(51) Int. Cl.
| | |
|---|---|
| *H01L 51/52* | (2006.01) |
| *H05K 5/00* | (2006.01) |
| *H01L 27/32* | (2006.01) |
| *H05K 7/20* | (2006.01) |
| *H01L 27/146* | (2006.01) |

(52) U.S. Cl.
CPC ...... *H01L 51/529* (2013.01); *H01L 27/14623* (2013.01); *H01L 27/322* (2013.01); *H01L 27/3272* (2013.01); *H05K 5/0017* (2013.01); *H05K 7/20963* (2013.01); *H01L 27/14621* (2013.01); *H01L 27/14625* (2013.01)

(58) Field of Classification Search
CPC ......... H01L 27/14621; H01L 27/14625; H01L 27/322; H01L 27/14623; H01L 27/14818; H01L 27/3272; H01L 51/529
See application file for complete search history.

(56) References Cited

U.S. PATENT DOCUMENTS

2017/0098675 A1* 4/2017 Chien ............... H01L 27/14623

FOREIGN PATENT DOCUMENTS

| | | |
|---|---|---|
| JP | 2015-220215 A | 12/2015 |
| KR | 10-1275794 B1 | 6/2013 |
| KR | 10-2020-0115761 A | 10/2020 |

* cited by examiner

*Primary Examiner* — David A Zarneke
(74) *Attorney, Agent, or Firm* — Innovation Counsel LLP

(57) ABSTRACT

A display module includes a display panel on which a display area and a non-display area surrounding the display area are defined and a functional layer disposed on the display panel. Here, the functional layer includes a color filter layer including a plurality of color filters and a plurality of first light shielding layers each disposed between the plurality of color filters, a light control layer including a plurality of light control parts overlapping the plurality of color filter layers, respectively, wherein at least one of the plurality of light control parts includes a quantum dot, and a heat conductive layer. The heat conductive layer includes at least one of metal, graphite, and silicon carbide.

17 Claims, 13 Drawing Sheets

DISPLAY MODULE

CROSS-REFERENCE TO RELATED APPLICATIONS

This U.S. non-provisional patent application claims priority under 35 U.S.C. § 119 to Korean Patent Application No. 10-2019-0061376, filed on May 24, 2019, the entire contents of which are hereby incorporated by reference.

BACKGROUND

The present disclosure herein relates to a display module, and more particularly, to a display module including a heat conductive layer.

A display device displays an image on a window by using light emitted from a display module. The emitted light may be light emitted from a light source. Alternatively, the emitted light may be light emitted in such a manner that a wavelength of the light emitted from the light source is converted. The emitted light may have an intensity or a color matching rate that is varied according to an internal environment of the display module.

The display device may further include a light modifier in addition to the display module. The light modifier may control the light emitted from the light source. In recent years, a display device including the light modifier containing a quantum dot has been developed. The wavelength of the light emitted from the light source may be varied by the quantum dot.

SUMMARY

The present disclosure provides a display module capable of minimizing increase in temperature inside a display panel.

An embodiment of the inventive concept provides a display module including: a display panel on which a display area and a non-display area surrounding the display area are defined; and a functional layer disposed on the display panel. Here, the functional layer includes: a color filter layer including a plurality of color filters and a plurality of first light shielding layers each disposed between the plurality of color filters; a light control layer including a plurality of light control parts overlapping the plurality of color filter layers, respectively, wherein at least one of the plurality of light control parts includes a quantum dot; and a heat conductive layer overlapping the plurality of first light shielding layers in a plan view and including at least one of metal, graphite, and silicon carbide.

In an embodiment, the heat conductive layer may not overlap with center portions of the plurality of color filters.

In an embodiment, the heat conductive layer may not transmit incident light.

In an embodiment, the heat conductive layer may include: a plurality of heat conductive particles each including at least one of the metal, the graphite, and the silicon carbide; and a body part in which the plurality of heat conductive particles are dispersed.

In an embodiment, the heat conductive layer may directly contact the plurality of first light shielding layers.

In an embodiment, the display module may further include an auxiliary heat conductive layer overlapping the heat conductive layer and disposed between the heat conductive layer and the display panel.

In an embodiment, the display module may further include a plurality of wall portions disposed between the plurality of first light shielding layers and the heat conductive layer, and each of the plurality of wall portions may be disposed between two adjacent light control parts of the plurality of light control parts in a plan view.

In an embodiment, the functional layer may further include a plurality of second light shielding layers disposed between the plurality of wall portions and the heat conductive layer.

In an embodiment, the heat conductive layer may overlap the plurality of color filters and the plurality of first light shielding layers in a plan view.

In an embodiment, the heat conductive layer may transmit incident light.

In an embodiment, the heat conductive layer may include a first heat conductive portion overlapping the display area and a second heat conductive portion overlapping the non-display area.

In an embodiment, the second heat conductive portion may extend from the first heat conductive portion.

In an embodiment, the second heat conductive portion may directly contact the first heat conductive portion.

In an embodiment, the second heat conductive portion may be bent so that at least one portion is disposed below the display panel.

In an embodiment, the heat conductive layer may directly contact the plurality of light control parts.

In an embodiment, at least one portion of the heat conductive layer may have an uneven shape.

In an embodiment, the display module may further include a capping layer overlapped with the heat conductive layer in a plan view.

In an embodiment of the inventive concept, a display module includes: a display panel configured to emit light; and a functional layer disposed on the display panel. Here, the functional layer includes: a light control layer including a plurality of wall portions and a plurality of light control parts disposed between the plurality of wall portions; and a heat conductive layer including at least one of metal, graphite, and silicon carbide, being transparent, and overlapping the plurality of wall portions and the plurality of light control parts.

In an embodiment, the display module may further include a color filter layer including a plurality of color filters and a plurality of light shielding layers each disposed between the plurality of color filters to overlap the heat conductive layer in a plan view. Here, the heat conductive layer may be disposed between the light control layer and the color filter layer.

In an embodiment, the heat conductive layer may be disposed between the light control layer and the display panel.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
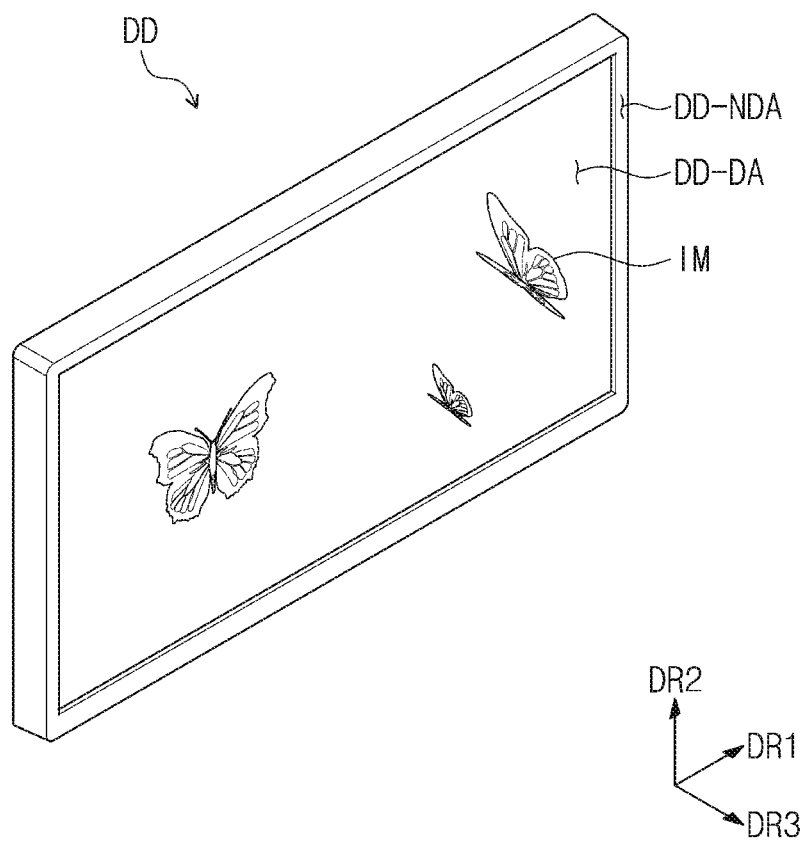
FIG. 1 is a perspective view illustrating a display device according to an embodiment.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, a display module according to an embodiment of the inventive concept will be described with reference to the accompanying drawings.

Figure 2:
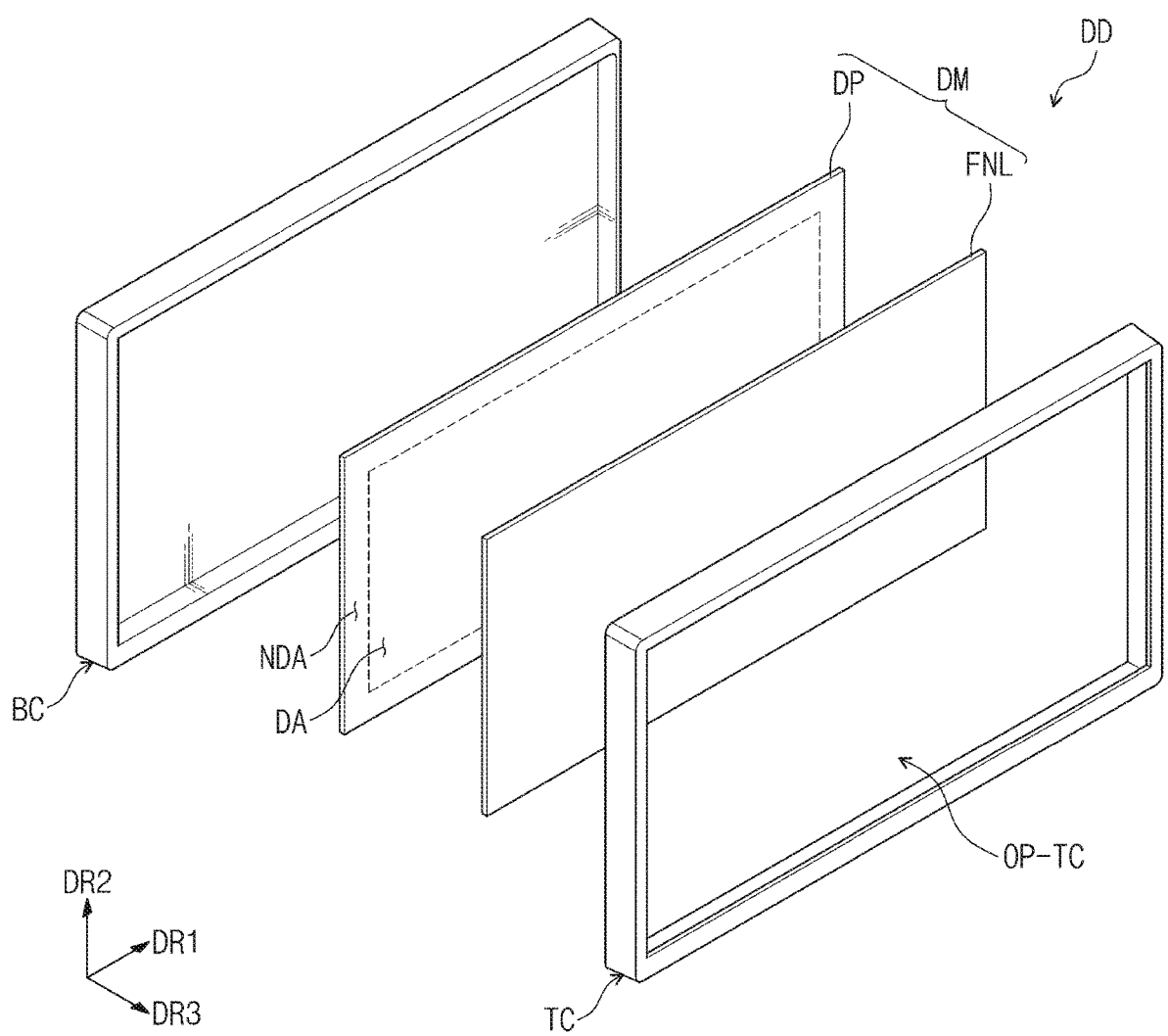
FIG. 2 is an exploded perspective view illustrating the display device in FIG. 1.

FIG. 1 is a perspective view illustrating a display device DD according to an embodiment of the inventive concept. FIG. 2 is an exploded perspective view illustrating the display device DD in FIG. 1. FIGS. 3 to 7 are cross-sectional views illustrating a display panel DP according to an embodiment of the inventive concept.

The display device DD may be activated according to an electrical signal. The display device DD may include various embodiments. For example, the display device DD may be a tablet PC, a notebook computer, a personal computer, and a smart TV. In an embodiment of the inventive concept, the display device DD is exemplarily illustrated as a television.

Referring to FIG. 1, a display area DD-DA and a non-display area DD-NDA may be included in the display device DD. The display area DD-DA may be an area on which an image IM is displayed. As an example of the image IM, a butterfly is illustrated in FIG. 1. The non-display area DD-NDA may be an area on which the image IM is not displayed. Pixels (not shown) may be disposed in the display area DD-DA, and the pixels (not shown) may not be disposed in the non-display area DD-NDA. The pixels (not shown) may represent effective pixels providing the image IM.

The display area DD-DA is parallel to a plane defined by a first directional axis DR1 and a second directional axis DR2. A normal direction of the display area DD-DA, i.e., a thickness direction of the display device DD, indicates a third directional axis DR3. A front surface (or top surface) and a rear surface (or bottom surface) of each of components is distinguished by the third directional axis DR3. However, directions indicated by the first to third directions DR1, DR2, and DR3 may be relative concepts and may be altered with respect to each other. Hereinafter, first to third directions may be directions indicated by the first to third directional axes DR1, DR2, and DR3, and designated by the same reference numerals, respectively.

The display device DD may be used for large-sized electronic devices such as televisions, monitors, or outdoor advertisement boards and small and medium-sized electronic devices such as personal computers, notebook computers, personal digital terminals, navigation units for vehicles, game consoles, portable electronic devices, and cameras. The above-described devices are exemplified as merely an exemplary embodiment, and thus, the display device may be adopted for other electronic devices unless departing from the spirit and scope of the inventive concept.

The display device DD may have a bezel area that is the non-display area DD-NDA. The non-display area DD-NDA may be disposed adjacent to the display area DD-DA. The non-display area DD-NDA may surround the display area DD-DA. However, the embodiment of the inventive concept is not limited thereto. For example, the display area DD-DA and the non-display area DD-NDA may be relatively designed in shape. In another embodiment of the inventive concept, the non-display area DD-NDA may be omitted.

Referring to FIG. 2, the display device DD may include a bottom cover BC, a display module DM, and a top cover TC. The bottom cover BC may be disposed below the display module DM to protect the display device DD against external impacts or pollutants.

The top cover TC may be disposed on the display module DM. The top cover TC may protect the display panel DP or the like against external impacts or pollutants. An opening OP-TC of the top cover TC may expose a front surface of the display panel DP to define the display area DD-DA. In another embodiment of the inventive concept, the top cover TC may be omitted. In case of the display device DD without the top cover TC, the non-display area DD-NDA may be defined by a sealing layer or a mold.

The display module DM may be disposed between the top cover TC and the bottom cover BC. The display module DM may include a display panel DP and a functional layer FNL. The display module DM according to an embodiment may further include a filling layer FL. However, the embodiment of the inventive concept is not limited to the constitution of the display module DM described above.

The display panel DP may have a light emitting display panel. For example, the display panel DP may be a light-emitting diode (LED) display panel, an organic electroluminescence display panel, or a quantum dot (QD) light emitting display panel. However, the embodiment of the inventive concept is not limited thereto.

The light-emitting diode (LED) display panel may include a light-emitting diode, a light emitting layer of the organic electroluminescence display panel may include an organic electroluminescence material, and a light emitting layer of the quantum dot light emitting display panel may include a quantum dot or a quantum rod. Hereinafter, in this specification, the display panel DP contained in the display device DD according to an embodiment will be described as the organic electroluminescence display panel. However, the embodiment of the inventive concept is not limited thereto.

Figure 3:
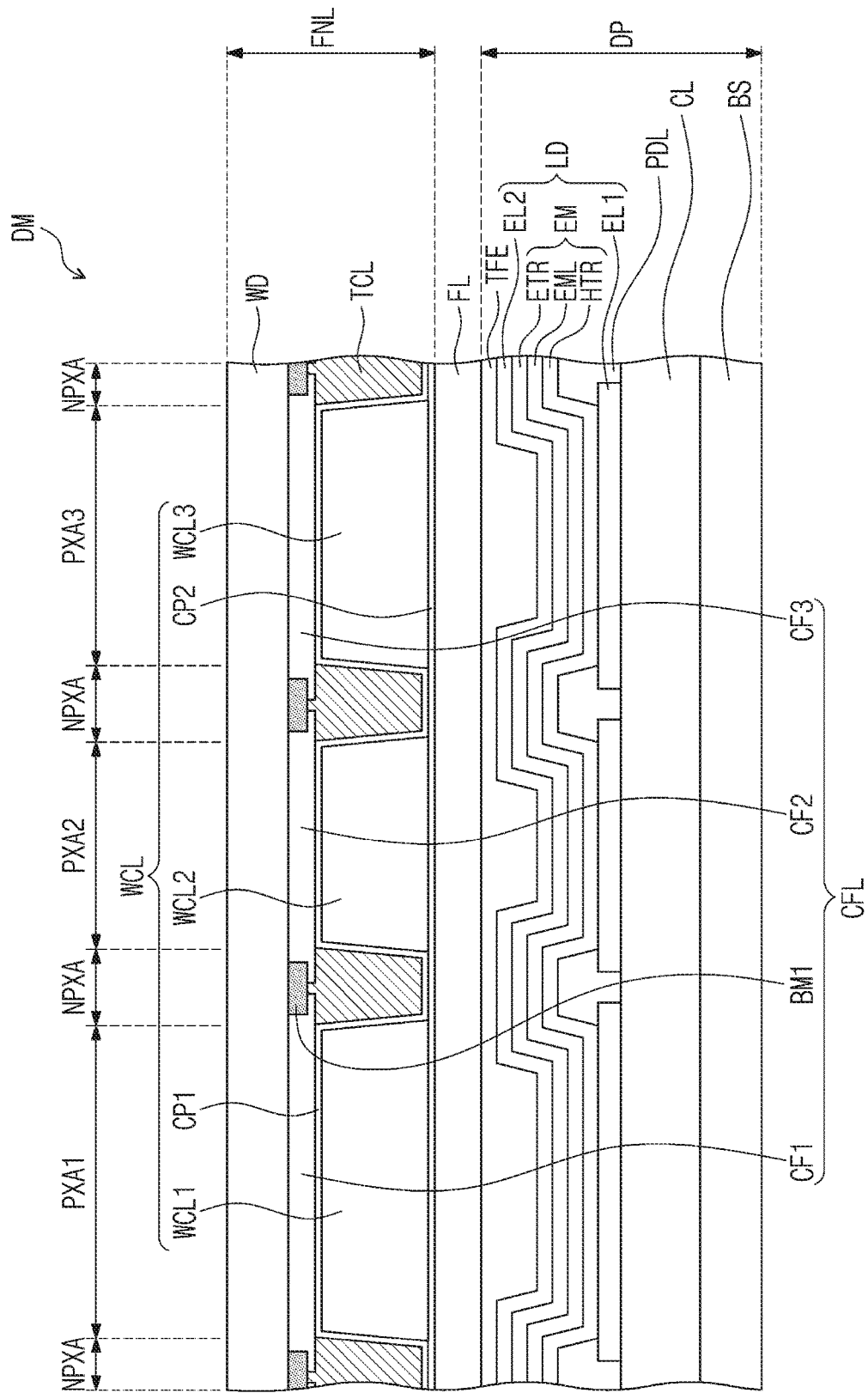
FIG. 3 is a cross-sectional view illustrating a display module according to an embodiment.

Referring to FIG. 3, the display panel DP may include a base substrate BS, a circuit layer CL, and a light emitting element layer LD. In an embodiment, the base substrate BS, the circuit layer CL, and the light emitting element layer LD may be sequentially laminated in the direction of the third directional axis DR3.

The base substrate BS may be a substrate providing a base surface on which the light emitting element layer LD is disposed. The base substrate BS may include glass, metal, or a synthetic resin. The base substrate BS may be rigid or flexible. According to an embodiment of the inventive concept, the base substrate BS may be rigid. However, the embodiment of the inventive concept is not limited thereto.

In an embodiment, the circuit layer CL may be disposed on the base substrate BS, and the circuit layer CL may include a plurality of transistors (not shown) and at least one capacitor. Each of the transistors (not shown) may include a control electrode, an input electrode, and an output electrode. For example, the circuit layer CL may include a switching transistor and a driving transistor, which are provided for driving the light emitting element layer LD.

A pixel defining layer PDL may be defined on the circuit layer CL. The pixel defining layer PDL may include a polymer resin. For example, the pixel defining layer PDL may include a polyacrylate-based resin or a polyimide-based resin. Also, the pixel defining layer PDL may further include an inorganic material in addition to the polymer resin. Also, the pixel defining layer PDL may include a light absorption material or include a black pigment or black dye. Also, the pixel defining layer PDL may include an inorganic material. For example, the pixel defining layer PDL may include a silicon nitride (SiNx), a silicon oxide (SiOx), or a silicon oxynitride (SiOxNy). The pixel defining layer PDL may define light emitting areas PXA1, PXA2, and PXA3. The light emitting areas PXA1, PXA2, and PXA3 and the non-light emitting area NPXA may be distinguished by an existence of the pixel defining layer PDL.

The light emitting element layer LD may include a first electrode EL1 and a second electrode EL2, which face each other, and a light emitting layer EM disposed between the first electrode EL1 and the second electrode EL2.

The first electrode EL1 may be disposed on the circuit layer CL. The first electrode EL1 may be electrically connected to a driving transistor (not shown) to receive a driving signal. The first electrodes EL1 may be spaced apart from each other between a plurality of pixel defining layers PDL. The first electrode EL1 has conductivity. The first electrode EL1 may be made of a metal alloy or a conductive compound. The first electrode EL1 may be an anode. In the light emitting element LD according to an embodiment, the first electrode EL1 may be a reflective electrode. However, the embodiment of the inventive concept is not limited thereto. For example, the first electrode EL1 may be a transmissive electrode or a transflective electrode.

The light emitting layer EM may be disposed on the first electrode. The light emitting layer EM may include a hole transport layer HTR, a light emitting layer EML, and an electron transport layer ETR. For example, the hole transport layer HTR may include a hole injection layer and a hole transport layer, and each of the hole injection layer and the hole transport layer may be made of a well-known hole injection material and a well-known hole transport material.

The light emitting layer EML may be disposed on the hole transport layer HTR. The light emitting layer EML may have a single layer structure made of a single material, a single layer structure made of a plurality of materials, which are different from each other, or a multi-layered structure including a plurality of layers made of a plurality of materials, which are different from each other.

The light emitting layer EML may emit first color light. That is, the display panel DP may emit the first color light. For example, the light emitting layer EML may be made of an organic material that emits blue light. However, the embodiment of the inventive concept is not limited thereto. For example, the light emitting layer EML may contain a fluorescent material and a phosphorus material, which emit the first color light.

The electron transport layer ETR is disposed on the light emitting layer EML. The electron transport layer ETR may include at least one of an electron transport layer and an electron injection layer. However, the embodiment of the inventive concept is not limited thereto.

When the electron transport layer ETR includes the electron transport layer and the electron injection layer, the electron injection layer and the electron transport layer may be made of a well-known electron injection material and a well-known electron transport material, respectively.

The second electrode EL2 may be disposed on the first electrode EL1 on the light emitting layer EM. At least one light emitting layer EM may be disposed between the first electrode EL1 and the second electrode EL2. The second electrode EL2 may be a common electrode or a cathode. The second electrode EL2 may be made of a metal alloy or a conductive compound. The second electrode EL2 may be a transmissive electrode, a transflective electrode, or a reflective electrode. When the second electrode EL2 is the transmissive electrode, the second electrode EL2 may be made of a transparent metal oxide such as, e.g., an indium tin oxide (ITO), an indium zinc oxide (IZO), a zinc oxide (ZnO), or an indium tin zinc oxide (ITZO).

The thin-film encapsulation layer TFE may be disposed on the second electrode EL2. The thin-film encapsulation layer TFE may be directly disposed on the second electrode EL2. The encapsulation layer TFE may be a single layer or a laminated plurality of layers. The thin-film encapsulation layer TFE may include an organic layer and/or an inorganic layer.

The display module DM according to an embodiment may further include a filling layer FL disposed on the display panel DP. That is, the filling layer FL may be disposed between the display panel DP and the functional layer FNL. The display panel DP and the functional layer FNL may be separately manufactured. The filling layer FL may fill a space between the display panel DP and the functional layer FNL. Particularly, the filling layer FL disposed on the display panel DP may provide one flat surface. The functional layer FNL may be stably disposed on the one flat surface of the filling layer FL.

The functional layer FNL may include a window WD, a color filter layer CFL, a light control layer WCL, and a heat conductive material TCL.

The window WD may be made of a material containing glass, sapphire, or plastic. The window WD may include a plurality of transmission areas, each of which allows light emitted from the light control layer WCL to be transmitted, and a light shielding area which surrounds the plurality of transmission areas and through which light is not transmitted.

The color filter layer CFL may be disposed below the window WD. The color filter layer CFL may include a first color filter CF1, a second color filter CF2, a third color filter CF3, and a plurality of first light shielding layers BM1 disposed between adjacent color filter layers. The first to third color filters CF1, CF2, and CF3 may be spaced apart from each other. The plurality of first light shielding layers BM1 may be disposed between the first to third color filters CF1, CF2, and CF3.

The first color filter CF1 may overlap a first light control part WCL1, the second color filter CF2 may overlap a second light control part WCL2, and the third color filter CF3 may overlap a third light control part WCL3. The first to third light control parts WCL1 to WCL3 will be described later. The first to third color filters CF1, CF2, and CF3 may selectively transmit wavelengths different from each other. For example, the first color filter CF1 may selectively transmit second color light and absorb the rest, the second color filter CF2 may selectively transmit third color light and absorb the rest, and the third color filter CF3 may selectively transmit first color light and absorb the rest.

That is, each of the first to third color filters CF1, CF2, and CF3 may transmit color light corresponding to light emitted from the first to third light control layers WCL1, WCL2, and WCL3 and absorb the rest. The first color filter CF1 may be a red color filter that transmits red light, the second color filter CF2 may be a green color filter that transmits green light, and the third color filter CF3 may be a blue color filter that transmits blue light.

Each of the first to third color filters CF1, CF2, and CF3 may include at least one of a pigment or a dye dispersed in a resin. The first to third color filters CF1, CF2, and CF3 may include different kinds of pigments and dyes. For example, the first color filter CF1 may contain at least one of a red pigment or a red dye, the second color filter CF2 may contain at least one of a green pigment or a green dye, and the third color filter CF3 may contain at least one of a blue pigment or a blue dye, However, the embodiment of the inventive concept is not limited thereto.

As the first to third color filters CF1, CF2, and CF3 are disposed on the light control parts, only light in a targeted wavelength range may be emitted from the color filters CF1, CF2, and CF3, and thus a color reproduction rate of the display device DD may increase. Also, since light incident from the outside into the display module DM is absorbed by the color filters CF1, CF2, and CF3 to reduce reflection of external light, visibility of the display device DD may improve.

The plurality of first light shielding layers BM1 may be disposed between the first to third color filters CF1, CF2, and CF3. The plurality of first light shielding layers BM1 may be disposed directly below the window WD. The plurality of first light shielding layers BM1 may be black matrixes. The plurality of first light shielding layers BM1 may be made of an organic light shielding material or an inorganic light shielding material, which contains a black pigment or a black dye. For example, the plurality of first light shielding layers BM1 may include carbon black particles. The plurality of first light shielding layers BM1 may prevent a light leakage phenomenon, and define a boundary between the adjacent plurality of color filters CF1, CF2, and CF3.

The plurality of first light shielding layers BM1 may overlap the non-light emitting area NPXA on a plane. As the plurality of first light shielding layers BM1 is provided, light emitted from the adjacent pixel areas may be prevented from being mixed. In an embodiment, the functional layer FNL may further include a plurality of second light shielding layers BM2. The plurality of second light shielding layers BM2 will be described later. The plurality of first light shielding layers BM1 and the plurality of second light shielding layers BM2 may be connected to one another to form a first light shielding layer BM1 and a second light shielding layer BM2 which include a plurality of openings that correspond to the light emitting areas PXA1, PXA2 and PXA3.

The display module DM may include a non-light emitting area NPXA and light emitting areas PXA1, PXA2, and PXA3. Each of the light emitting areas PXA1, PXA2, and PXA3 may be an area through which light generated from the light emitting element layer LD is emitted. The light emitting areas PXA1, PXA2, and PXA3 may have areas different from each other. Here, the area may represent an area when viewed on the plane.

The light emitting areas PXA1, PXA2, and PXA3 may include a plurality of light emitting groups according to a color of light emitted therefrom. In the display module DM according to an embodiment in FIG. 3, the three light emitting areas PXA1, PXA2, and PXA3 which emit red light, green light, and blue light, respectively, are exemplarily illustrated. For example, the display device DD according to an embodiment may include the red light emitting area PXA1, the green light emitting area PXA2, and the blue light emitting area PXA3.

In the display module DM according to an embodiment in FIG. 3, the display panel DP is illustrated to include the light emitting element layer LD including the light emitting layer EML as a common layer. That is, in an embodiment of FIG. 3, the display panel DP may emit light in the same wavelength range regardless of the light emitting areas PXA1, PXA2, and PXA3 of the display module DM. For example, the display panel DP may provide the blue light, which is the first color light, to the light control layer WCL.

In the display module DM according to an embodiment in FIG. 3, the light emitting areas PXA1, PXA2, and PXA3 may have different areas according to colors emitted from the plurality of light control parts WCL1, WCL2, and WCL3. For example, in the display module DM according to an embodiment, the red light emitting area PXA1, which corresponds to the first light control part WCL1 transmitting red light, may have a greatest area, and the green light emitting area PXA2, which corresponds to the second light control part WCL2 generating and emitting green light, may have a smallest area. However, the embodiment of the inventive concept is not limited thereto. For example, the light emitting areas PXA1, PXA2, and PXA3 may emit light having different colors other than the red light, the green light, and the blue light.

The light emitting areas PXA1, PXA2, and PXA3 may be separated by the pixel defining layer PDL. The non-light emitting areas NPXA may be disposed between the neighboring light emitting areas PXA1, PXA2, and PXA3 and correspond to the pixel defining layer PDL.

The light control layer WCL may be disposed between the color filter layer CFL and the light emitting element layer LD. The light control layer WCL may absorb light emitted from the light emitting element layer LD and alter wavelengths of absorbed light to have a specific wavelength range that is different from that of the absorbed light or transmit light emitted from the light emitting element layer LD without alteration. The base substrate BS may serve as a support substrate that supports the light control layer WCL. The base substrate BS may include a glass substrate or a plastic substrate.

The light control layer WCL according to an embodiment may include the first to third light control parts WCL1, WCL2, and WCL3. The first light control part WCL1 may include a quantum dot converting the first color light into the second color light. The second light control part WCL2 may include a quantum dot converting the first color light into the third color light. The third light control part WCL3 may not include a quantum dot. The third light control part WCL3 may transmit the first color light. The second color light may have a wavelength range greater than that of each of the first color light and the third color light. The third color light may have a wavelength range greater than that of the first color light. For example, the first color light may be blue light, the second color light may be red light, and the third color light may be green light. Also, the first color light may be provided from the display panel DP to the light control layer WCL.

The quantum dot is a particle converting a wavelength of light provided from the display panel DP. The quantum dot may be selected from the group consisting of Group II-VI compound, Group III-V compound, Group IV-VI compound, Group IV element, Group IV compound, and a combination thereof.

The Group II-VI compound may be selected from the group consisting of: a binary compound selected from the group consisting of CdSe, CdTe, ZnS, ZnSe, ZnTe, ZnO, HgS, HgSe, HgTe, MgSe, MgS, and a combination thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The III-V compound may be selected from the group consisting of: a binary compound selected from the group consisting of GaN, GaP, GaAs, GaSb, AN, AlP, AlAs, AlSb, InN, InP, InAs, InSb, and a combination thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The IV-VI compound may be selected from the group consisting of: a binary compound selected from the group consisting of SnS, SnSe, SnTe, PbS, PbSe, PbTe, and a combination thereof; a ternary compound selected from the group consisting of SnSeS, SnSeTe, SnSTe, PbSeS, PbSeTe, PbSTe, SnPbS, SnPbSe, SnPbTe, and a combination thereof; and a quaternary compound selected from the group consisting of SnPbSSe, SnPbSeTe, SnPbSTe, and a combination thereof. The Group IV compound may be selected from the group consisting of Si, Ge, and a combination thereof. The Group IV compound may be a binary compound selected from the group consisting of SiC, SiGe, and a combination thereof.

Here, the binary compound, the ternary compound, and the quaternary compound may exist in a particle with a uniform concentration or exist in a particle with a non-uniform concentration.

The quantum dot may have a core-shell structure including a core and a shell surrounding the core. Alternatively, the quantum dot may have a core-shell structure in which one quantum dot surrounds another quantum dot. An interface between the core and the shell may have a concentration gradient in which a concentration of an element existing in the shell gradually decreases in a direction toward a center thereof.

In some embodiments, the quantum dot may have a core-shell structure including a core having a nanocrystal and a shell surrounding the core. The shell of the quantum dot may serve as a protection layer for preventing the core from being chemically denaturalized to maintain semiconductor characteristics and/or a charging layer for applying electrophoretic characteristics to the quantum dot. The shell may be a single layer or multi-layers. An interface between the core and the shell may have a concentration gradient in which a concentration of an element existing in the shell gradually decreases in a direction toward a center of the core. The shell of the quantum dot may include, e.g., a metallic or nonmetallic oxide, a semiconductor compound, or a combination thereof.

For example, the metallic or nonmetallic oxide used in the shell may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO or a ternary compound such as $MgAl_2O_4$, $CoFe_2O_4$, $NiFe_2O_4$, $CoMn_2O_4$. However, the embodiment of the inventive concept is not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb. However, the embodiment of the inventive concept is not limited thereto.

The quantum dot may have a full width of half maximum (FWHM) of a light emitting wavelength spectrum, which is equal to or less than about 45 nm, desirably equal to or less than about 40 nm, more desirably equal to or less than about 30 nm, and, in this range, a color purity or a color reproduction property may be improved. Also, since light emitted through the above-described quantum dot is emitted in all directions, a viewing angle may be improved.

Also, although the quantum dot has a shape that is generally used in the art, the embodiment of the inventive concept is not limited thereto. More particularly, the quantum dot may have a shape such as a globular shape, a pyramid shape, a multi-arm shape, or a shape of a nanoparticle, a nano-tube, a nano-wire, a nano-fiber, or a nanoplate shaped particle of a cubic.

The quantum dot may adjust a color of emitted light according to a particle size. Thus, the quantum dot may have various light emitting colors such as blue, red, or green. As the particle size decreases, the quantum dot may emit light in a short wavelength range. For example, the particle size of the quantum dot emitting green light may be less than that of the quantum dot emitting red light.

The light control layer WCL may include a heat conductive layer TCL. Referring to FIG. 3, the heat conductive layer TCL may overlap the plurality of first light shielding layers BM1 in a plan view. In an embodiment, the heat conductive layer TCL may directly contact the plurality of first light shielding layers BM1. The heat conductive layer TCL may not overlap center portions of the first color filter CF1, the second color filter CF2 and the third color filter CF3.

The heat conductive layer TCL may include at least one of metal, graphite, and silicon carbide. That is, the heat conductive layer TCL may be a material having a high thermal conductivity. The heat conductive layer TCL may dissipate heat inside the display module DM to the outside of the display module DM.

The heat conductive layer TCL according to an embodiment may not transmit incident light from outside of the display module DM. For example, the heat conductive layer TCL may absorb the incident light from outside of the display module DM. As illustrated in FIG. 3, the heat conductive layer TCL disposed between the plurality of light control parts WCL1, WCL2, and WCL3 may absorb light emitted from the plurality of light control parts WCL1, WCL2, and WCL3. That is, the light emitted from the plurality of light control parts WCL1, WCL2, and WCL3 may be prevented from being mixed with each other. As the heat conductive layer TCL absorbs light emitted from the plurality of light control parts WCL1, WCL2, and WCL3, a color mixture of light in the window WD may be prevented.

The heat conductive layer TCL and the plurality of light control parts WCL1, WCL2, and WCL3 may be disposed close to each other to quickly dissipate heat generated from the plurality of light control parts WCL1, WCL2, and WCL3

The display module DM according to an embodiment may further include a plurality of capping layers CP1 and CP2. The plurality of capping layers CP1 and CP2 are disposed to cover the plurality of light control parts WCL1, WCL2, and WCL3. The plurality of capping layers CP1 and CP2 may prevent moisture and/or oxygen (hereinafter, referred to as 'moisture/oxygen') from being permeated into the plurality of light control parts WCL1, WCL2, and WCL3. The plurality of capping layers CP1 and CP2 may be disposed to completely surround the plurality of light control parts WCL1, WCL2, and WCL3 to prevent the plurality of light control parts WCL1, WCL2, and WCL3 from being exposed to the moisture/oxygen. The plurality of capping layers CP1 and CP2 may be disposed adjacent to the heat conductive layer TCL to prevent the heat conductive layer TCL from being exposed to the moisture/oxygen through the display panel DP.

Each of the plurality of capping layers CP1 and CP2 may include an inorganic material. For example, the plurality of capping layers CP1 and CP2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, or a metal thin-film securing a light transmittance. However, the embodiment of the inventive concept is not limited thereto. For example, the plurality of capping layers CP1 and CP2 may include an organic material. Also, regardless of illustration in the drawings, the capping layers may be partially omitted or further added.

When the heat conductive layer TCL according to an embodiment is metal, the capping layers CP1 and CP2 may prevent static electricity generated from the heat conductive layer TCL.

Figure 4:
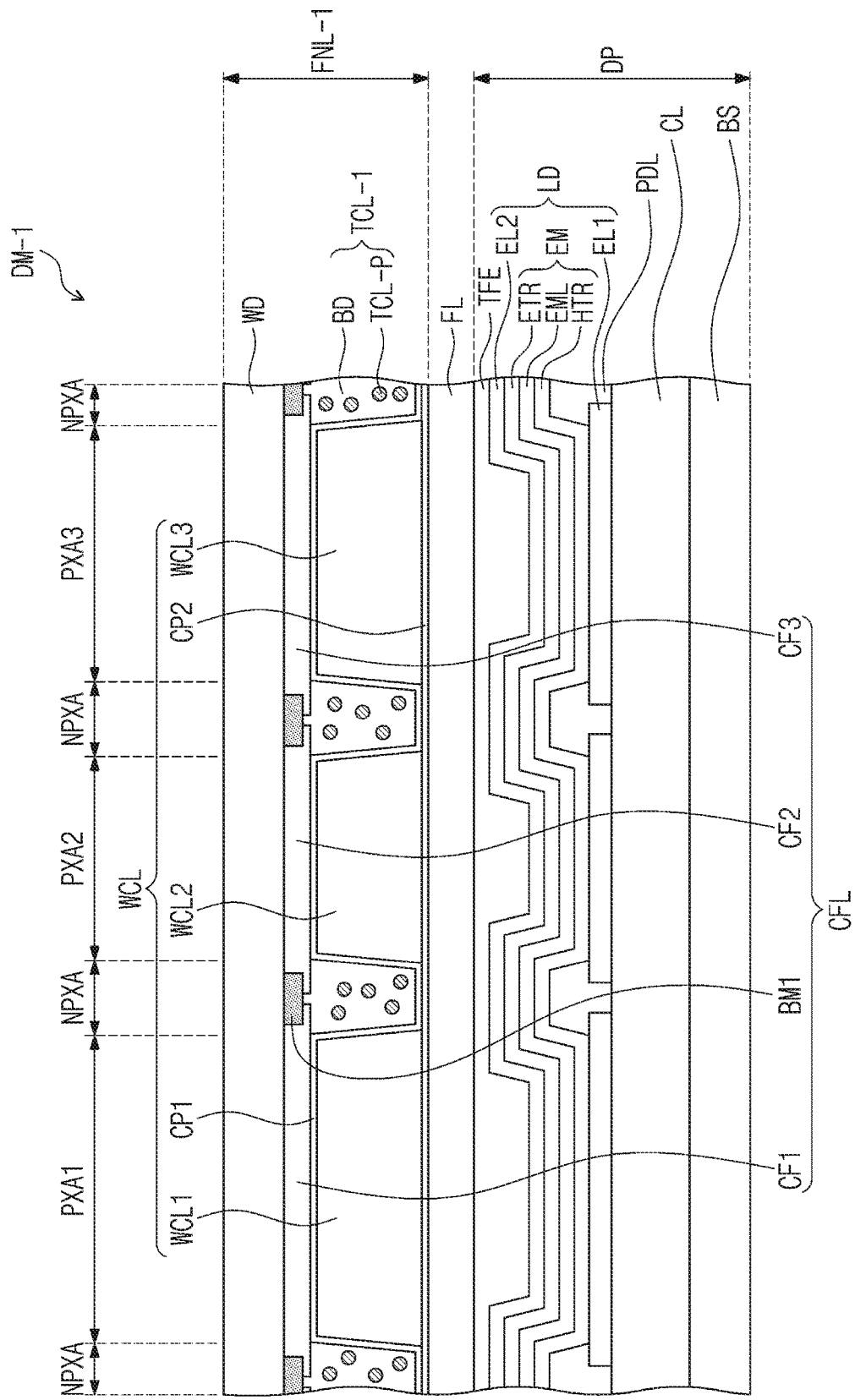
FIG. 4 is a cross-sectional view illustrating a display module according to an embodiment.

Referring to FIG. 4, a heat conductive layer TCL-1 according to an embodiment may include a body part BD and a plurality of heat conductive particles TCL-P. Each of the plurality of heat conductive particles TCL-P may include at least one of the metal, the graphite, and the silicon carbide. The body part BD may be a base that accommodates the plurality of heat conductive particles TCL-P. Other than the heat conductive layer TCL-1, the descriptions in FIG. 3 may be applied in the same manner.

Figure 5:
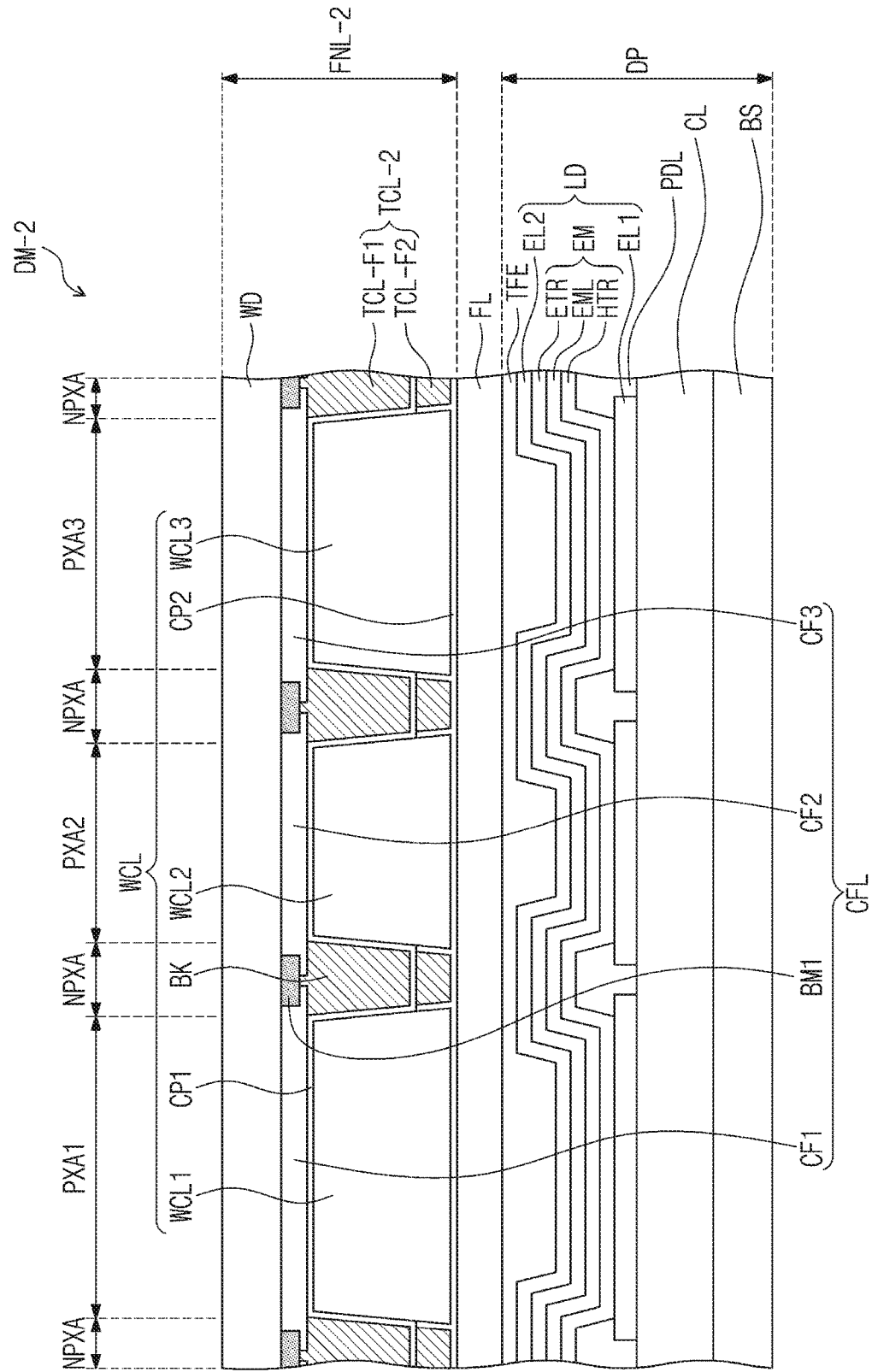
FIG. 5 is a cross-sectional view illustrating a display module according to an embodiment.

Referring to FIG. 5, a heat conductive layer TCL-2 according to an embodiment may include a main heat conductive layer TCL-F1 and an auxiliary heat conductive layer TCL-F2. The auxiliary heat conductive layer TCL-F2 may overlap the main heat conductive layer TCL-F1 with a capping layer CP1 disposed between the main heat conductive layer TCL-F1 and an auxiliary heat conductive layer TCL-F2. Also, the auxiliary heat conductive layer TCL-F2 may be disposed between the main heat conductive layer TCL-F1 and the display panel DP. As a height of each of a plurality of light control parts WCL1, WCL2, and WCL3 increases, the number of heat conductive layers laminated may also increase. Although the auxiliary heat conductive layer TCL-F2 is illustrated as one layer in FIG. 5, the embodiment of the inventive concept is not limited thereto. For example, a plurality of layers of the auxiliary heat conductive layer TCL-F2 may be laminated. Thus, although the height of each of the plurality of light control parts WCL1, WCL2, and WCL3 increases, a color mixture may be prevented. Other than the heat conductive layer TCL-F2, the descriptions in FIG. 3 may be applied in the same manner.

Figure 6:
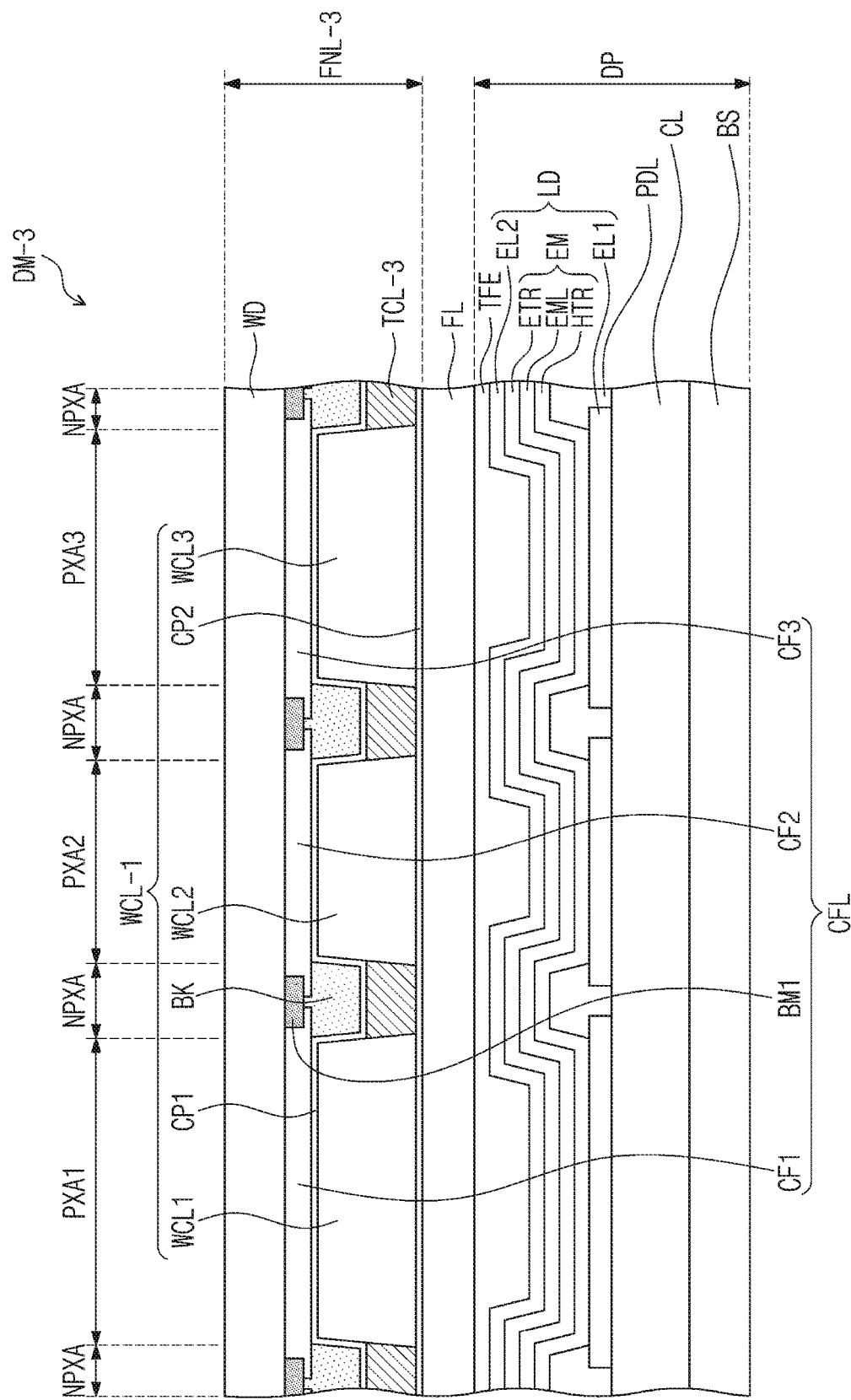
FIG. 6 is a cross-sectional view illustrating a display module according to an embodiment.

Referring to FIG. 6, a light control layer WCL-1 according to an embodiment may further include a plurality of wall portions BK. The plurality of wall portions BK may be disposed between a plurality of first light shielding layers BM1 and a heat conductive layer TCL-3. Each of the plurality of wall portions BK 1 may be disposed between two adjacent light control parts WCL1, WCL2, and WCL3 of a plurality of light control parts WCL1, WCL2, and WCL3. Other than plurality of wall portions BK, the descriptions in FIG. 3 may be applied in the same manner.

Figure 7:
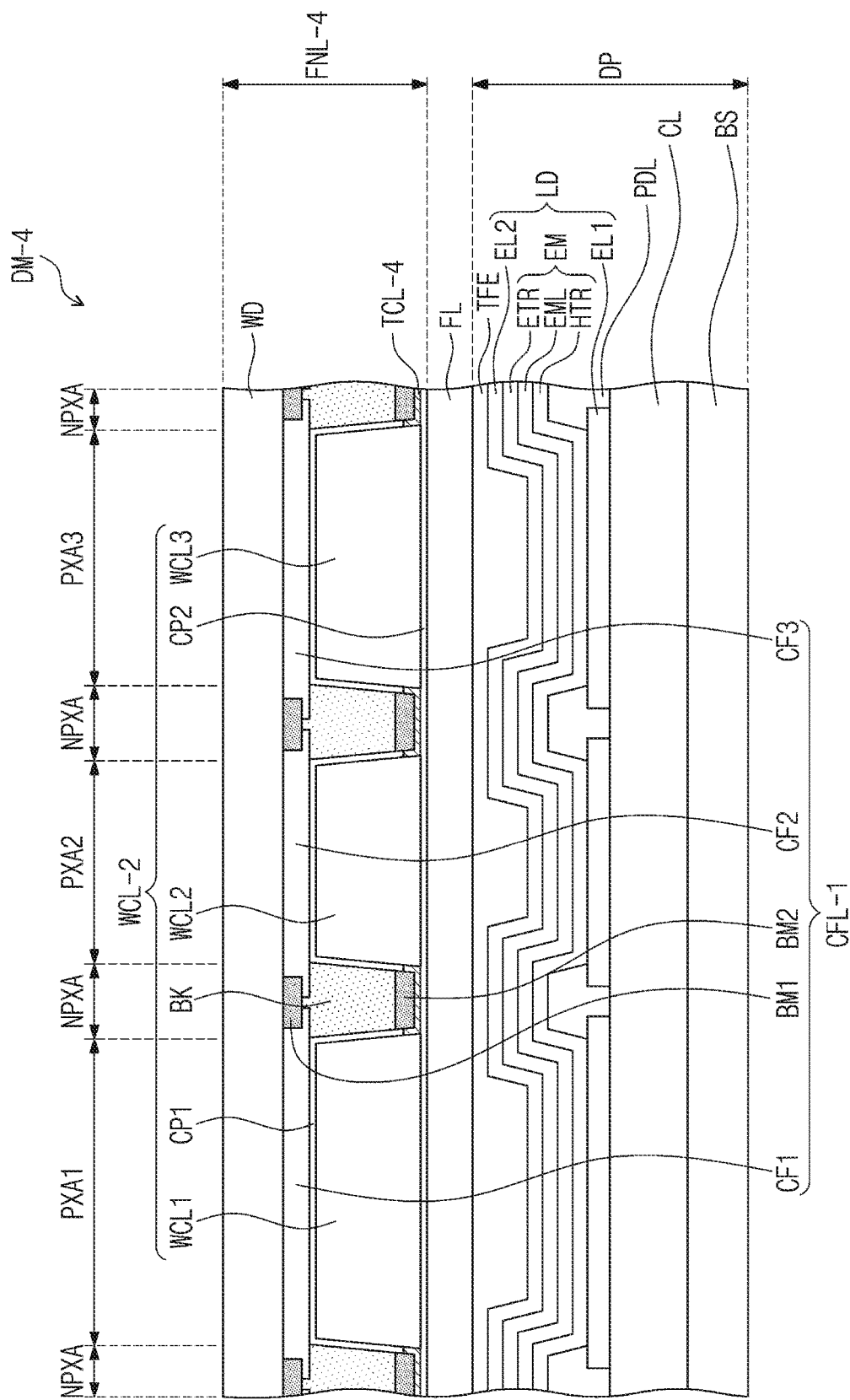
FIG. 7 is a cross-sectional view illustrating a display module according to an embodiment.

Referring to FIG. 7, a color filter layer CFL-1 according to an embodiment may further include a plurality of second light shielding layers BM2. The plurality of second light shielding layers BM2 may be disposed between a plurality of wall portions BK and a heat conductive layer TCL-4. The heat conductive layer TCL-4 may be disposed to cover a lower end of each of the plurality of second light shielding layers BM2. As the color filter layer CFL-1 further includes the plurality of second light shielding layers BM2, a color mixture of light emitted from a plurality of light control parts WCL1, WCL2, and WCL3 may be prevented. Other than the color filter layer CFL-1, the descriptions in FIG. 3 may be applied in the same manner.

Figure 8:
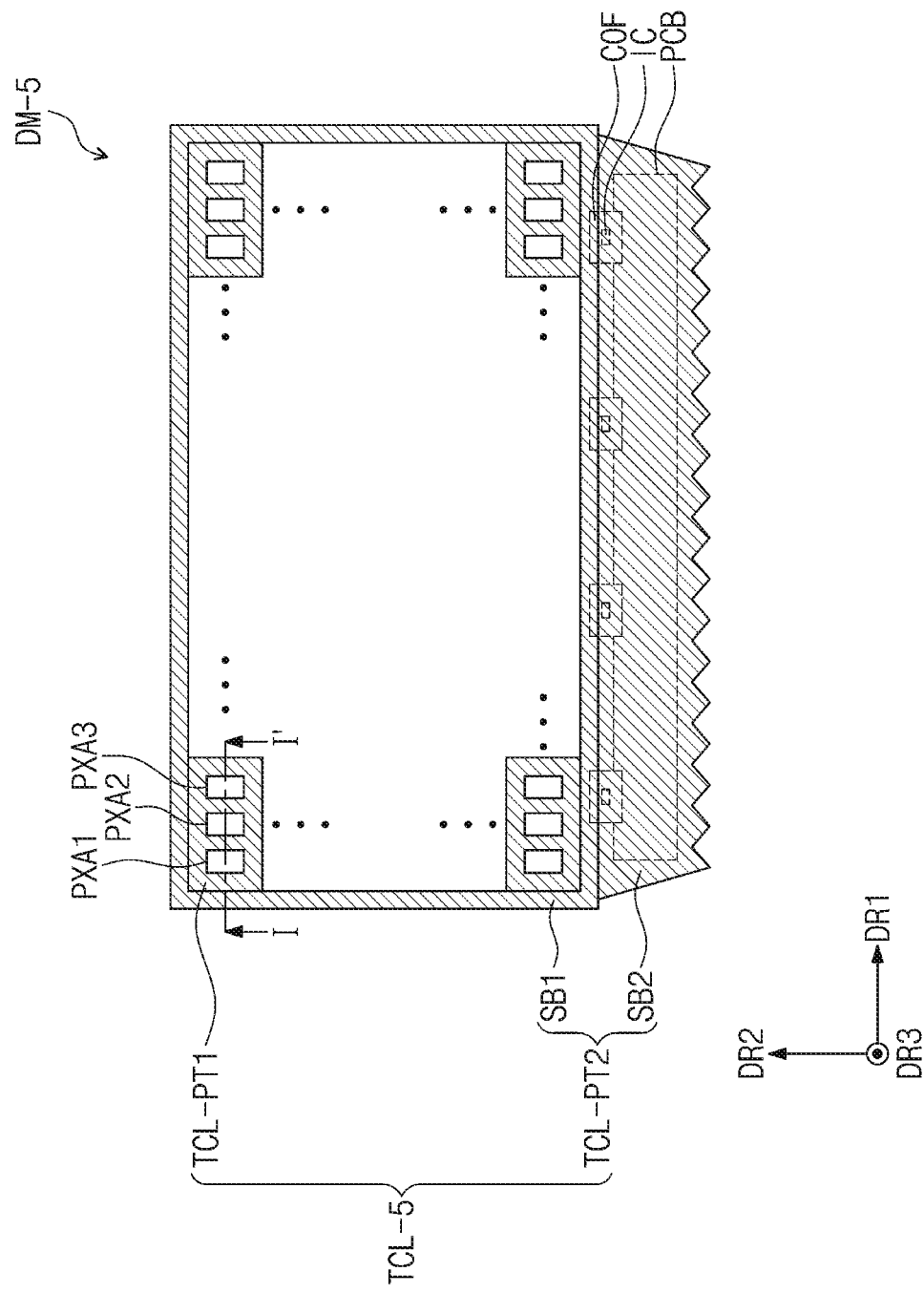
FIG. 8 is a plan view illustrating a display module according to an embodiment.
Figure 9:
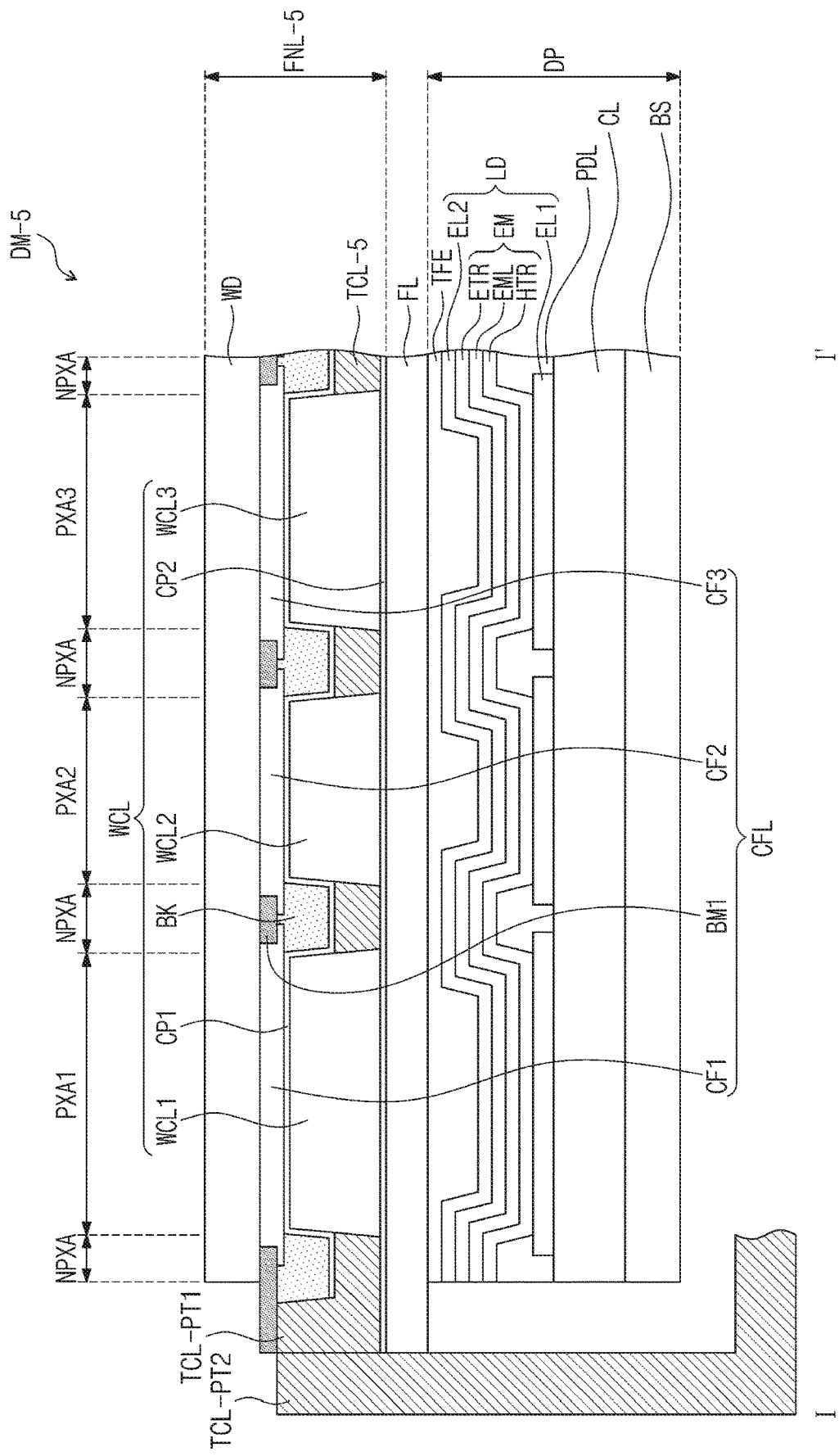
FIG. 9 is a cross-sectional view taken along line I-I' of the display module in FIG. 8.

FIG. 8 is a plan view illustrating a display module DM-5 according to an embodiment. FIG. 9 is a cross-sectional view taken along line I-I' of the display module DM in FIG. 8.

A heat conductive layer TCL-5 according to an embodiment may include a first heat conductive portion TCL-PT1 and a second heat conductive portion TCL-PT2. The first heat conductive portion TCL-PT1 may overlap the display area DA (refer to FIG. 2) of the display panel DP. The second heat conductive portion TCL-PT2 may overlap the non-display area NDA (refer to FIG. 2) of the display panel DP.

In the display module DM-5 according to an embodiment, the second heat conductive portion TCL-PT2 may extend from the first heat conductive portion TCL-PT1. However, the embodiment of the inventive concept is not limited thereto. The first heat conductive portion TCL-PT1 and the second heat conductive portion TCL-PT2 may be separately manufactured and then contact each other. That is, the second heat conductive portion TCL-PT2 may be physically directly connected to the first heat conductive portion TCL-PT1.

The second heat conductive portion TCL-PT2 may receive heat inside the display module DM-5 through the first heat conductive portion TCL-PT1. The second heat conductive portion TCL-PT2 may quickly dissipate the received heat to the outside of the display module DM-5.

The second heat conductive portion TCL-PT2 according to an embodiment may include a first sub-area SB1 and a second sub-area SB2. The first sub-area SB1 may be the second heat conductive portion TCL-PT2 surrounding the display area DA (refer to FIG. 2). The second sub-area SB2 may have a shape protruding from the first sub-area SB1. As the display module DM-5 further includes the second sub-area SB2, the heat conductive layer TCL-5 may increase in cross-sectional area. The second sub-area SB2 may be bent so that at least one portion is disposed below the display panel DP.

For example, as illustrated in FIG. 8, a printed circuit board PCB may be disposed below the second sub-area SB2. The printed circuit board PCB may be electrically connected to the display panel DP. On the printed circuit board PCB, a chip on film COF including a source drive IC (IC) may be disposed. Other than the second heat conductive portion TCL-PT2, the descriptions in FIG. 3 may be applied in the same manner.

Figure 10:
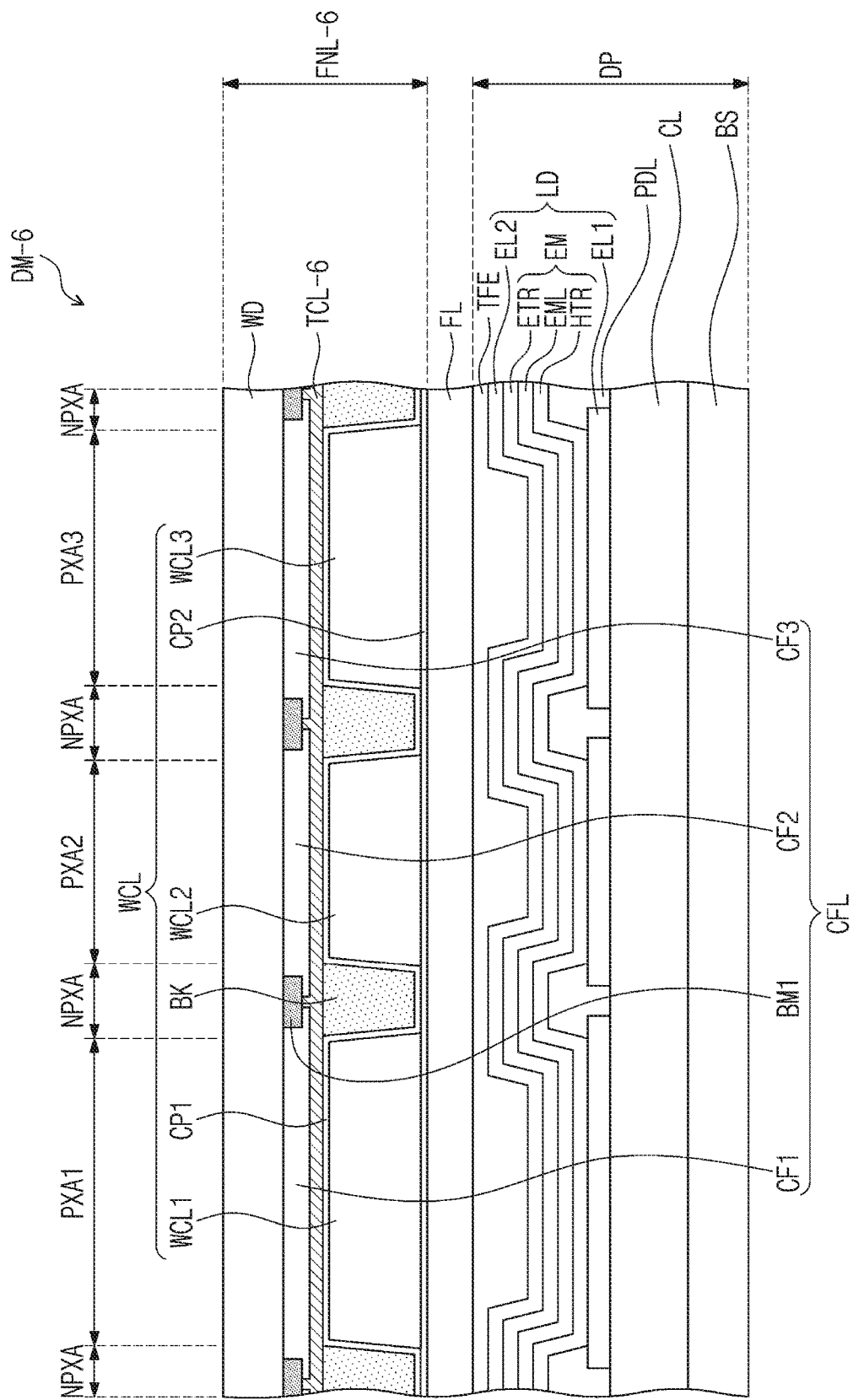
FIG. 10 is a cross-sectional view illustrating a display module according to an embodiment.
Figure 11:
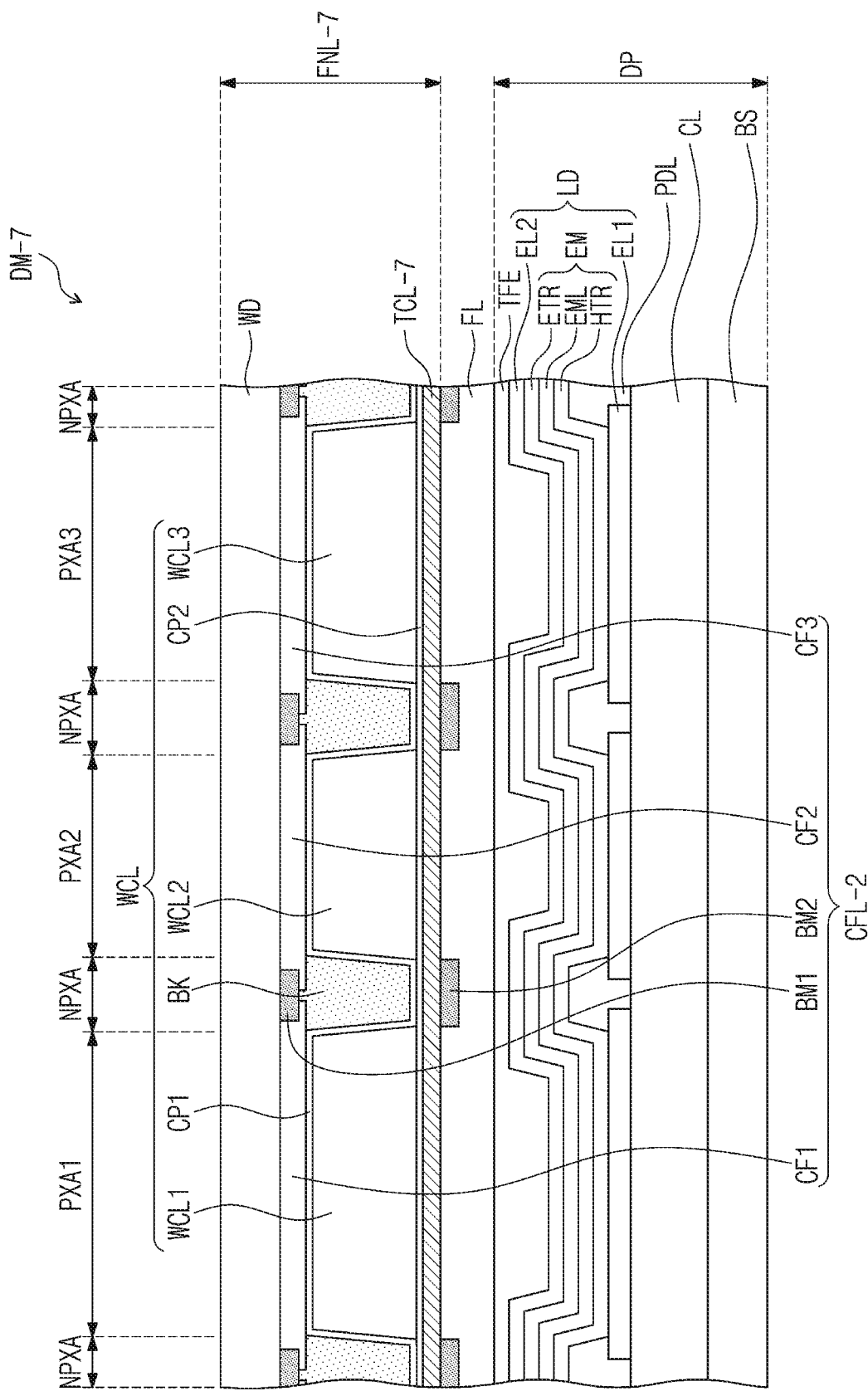
FIG. 11 is a cross-sectional view illustrating a display module according to an embodiment.
Figure 12:
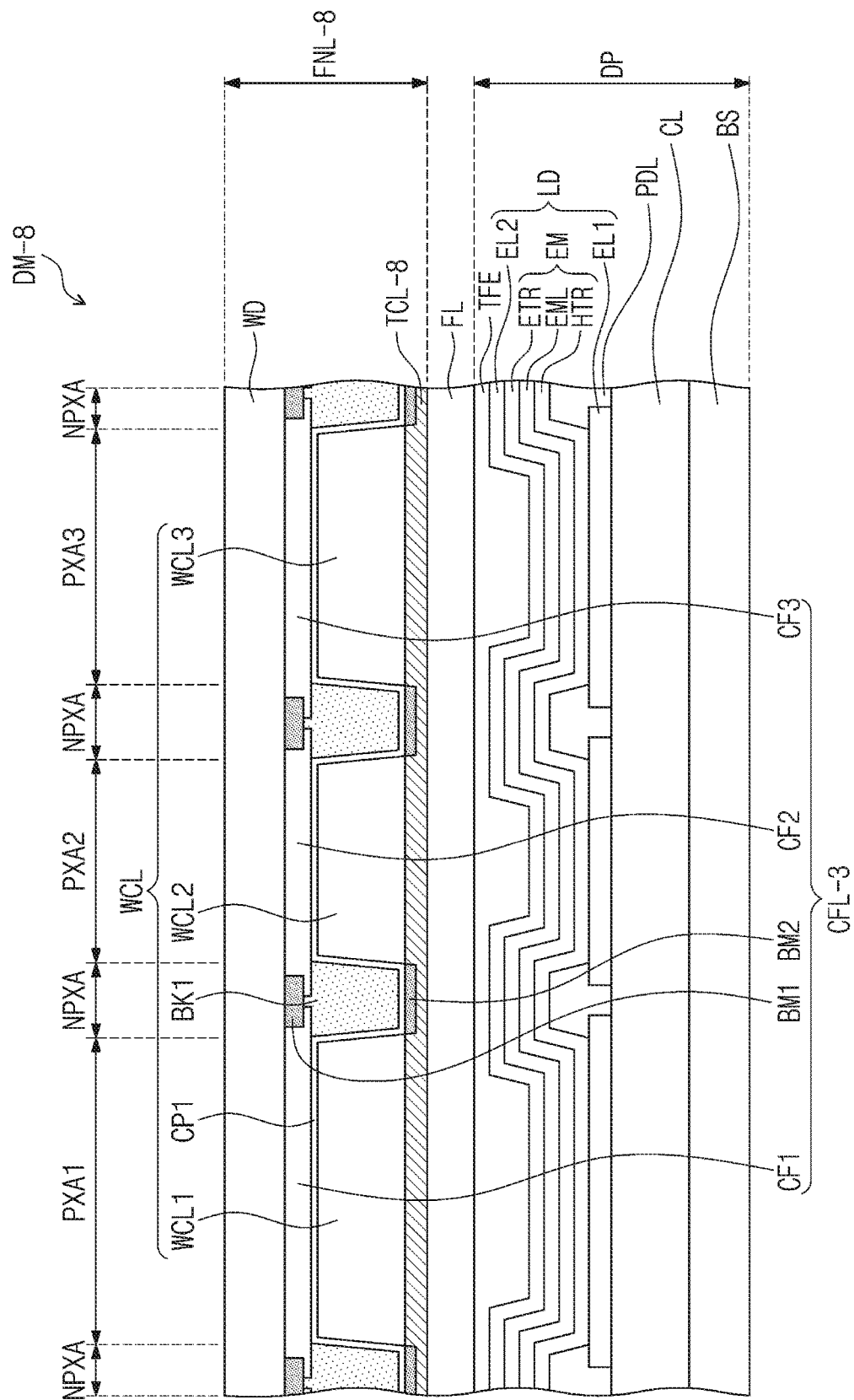
FIG. 12 is a cross-sectional view illustrating a display module according to an embodiment.

FIGS. 10 to 12 are cross-sectional views illustrating a display module DM-6, DM-7, and DM-8 according to an embodiment.

Referring to FIG. 10, a heat conductive layer TCL-6 according to an embodiment may overlap a plurality of color filters CF1, CF2, and CF3 and a plurality of first light shielding layers BM1. That is, the heat conductive layer TCL-6 may be disposed on the plurality of color filters CF1, CF2, and CF3 and the plurality of first light shielding layers BM1 to completely cover the plurality of color filters CF1, CF2, and CF3 and the plurality of first light shielding layers BM1 in a plan view. The heat conductive layer TCL-6 according to an embodiment may transmit incident light. For example, the heat conductive layer TCL-6 may transmit light emitted from a plurality of light control parts WCL1, WCL2, and WCL3 to a window WD.

The heat conductive layer TCL-6 according to an embodiment may be disposed between a color filter layer CFL and a light control layer WCL. As the heat conductive layer TCL-6 is deposited on the front surface, the heat conductive layer TCL-6 may increase in cross-sectional area. Thus, a heat dissipation efficiency of the heat conductive layer TCL-6 may increase. Other than the heat conductive layer TCL-6 and the plurality of wall portions BK disposed between the heat conductive layer TCL-6 and the display panel DP between adjacent light control parts, the descriptions in FIG. 3 may be applied in the same manner.

Referring to FIG. 11, a heat conductive layer TCL-7 according to an embodiment may be disposed below a light control layer WCL. As the heat conductive layer TCL-7 is disposed adjacent to the display panel DP, the heat conductive layer TCL-7 may receive heat generated from the light emitting element layer LD. That is, the heat conductive layer TCL-7 may dissipate the heat generated from the light emitting element layer LD more efficiently. A color filter layer CFL-2 according to an embodiment may further include a plurality of second light shielding layers BM2. The plurality of second light shielding layers BM2 may be disposed below the heat conductive layer TCL-7. As the color filter layer CFL-2 further includes the plurality of second light shielding layers BM2, a color mixture of light emitting from a plurality of light control parts WCL1, WCL2, and WCL3 may be prevented. Other than the heat conductive layer TCL-7, the plurality of second light shielding layers BM2 and the plurality of wall portions BK disposed between the heat conductive layer TCL-7 and the plurality of first light shielding layers BM1 between adjacent light control parts, the descriptions in FIG. 3 may be applied in the same manner.

Referring to FIG. 12, a color filter layer CFL-3 according to an embodiment may further include a plurality of second light shielding layers BM2. The plurality of second light shielding layers BM2 may be covered by a heat conductive layer TCL-8. As the color filter layer CFL-3 further includes the plurality of second light shielding layers BM2, a color mixture of light emitted from a plurality of light control parts WCL1, WCL2, and WCL3 may be prevented. Other than a location of the second light shielding layers BM2, the descriptions in FIG. 11 may be applied in the same manner.

Figure 13:
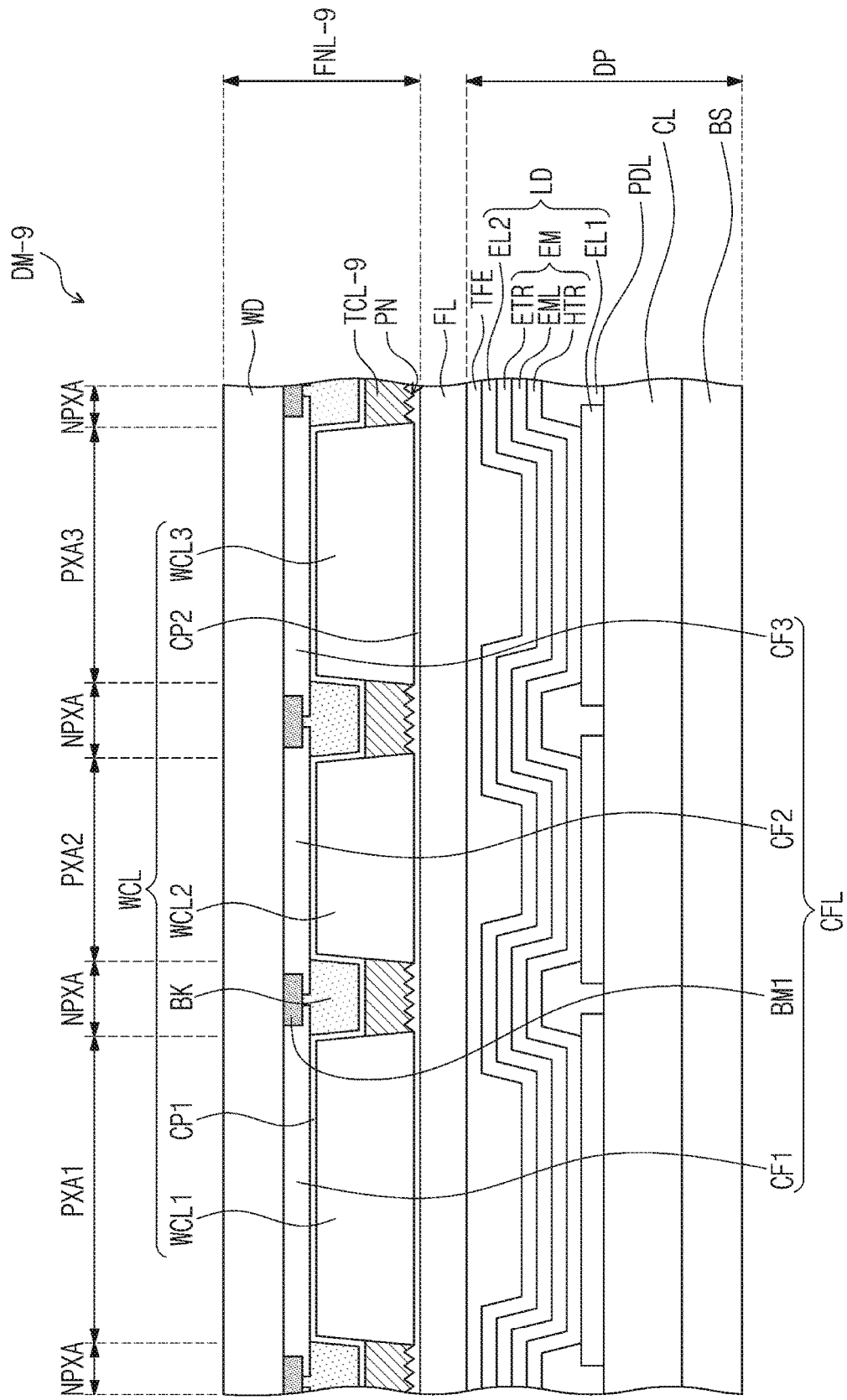
FIG. 13 is a cross-sectional view illustrating a display module according to an embodiment.

FIG. 13 is a cross-sectional view illustrating a display module DM-9 according to an embodiment.

Referring to FIG. 13, at least a portion of a heat conductive layer TCL-9 according to an embodiment may have an uneven surface PN. The heat conductive layer TCL-9 may increase in cross-sectional area by the uneven surface PN. That is, a heat dissipation efficiency of the heat conductive layer TCL-9 may further increase. This may be applied to the above-described embodiments.

The display module according to the embodiment of the inventive concept may minimize the increase in temperature inside the display module.

Although the exemplary embodiments of the present inventive concept have been described, it is understood that the present inventive concept should not be limited to these exemplary embodiments but various changes and modifications can be made by one ordinary skilled in the art within the spirit and scope of the present inventive concept as hereinafter claimed.

Hence, the real protective scope of the present inventive concept shall be determined by the technical scope of the accompanying claims.

What is claimed is:

1. A display module comprising:
   a display panel on which a display area and a non-display area surrounding the display area are defined; and
   a functional layer disposed on the display panel,
   wherein the functional layer comprises:
   a color filter layer comprising a plurality of color filters and a plurality of first light shielding layers each disposed between the plurality of color filters;
   a light control layer comprising a plurality of light control parts overlapping the plurality of color filters, respectively, wherein at least one of the plurality of light control parts comprises a quantum dot; and
   a heat conductive layer overlapping the plurality of first light shielding layers in a plan view and comprising at least one of metal, graphite, and silicon carbide.

2. The display module of claim 1, wherein the heat conductive layer does not overlap with center portions of the plurality of color filters.

3. The display module of claim 2, wherein the heat conductive layer does not transmit incident light.

4. The display module of claim 2, wherein the heat conductive layer comprises:
   a plurality of heat conductive particles each comprising at least one of the metal, the graphite, and the silicon carbide; and
   a body part in which the plurality of heat conductive particles are dispersed.

5. The display module of claim 2, wherein the heat conductive layer directly contacts the plurality of first light shielding layers.

6. The display module of claim 2, further comprising an auxiliary heat conductive layer overlapping the heat conductive layer and disposed between the heat conductive layer and the display panel.

7. The display module of claim 2, further comprising a plurality of wall portions disposed between the plurality of first light shielding layers and the heat conductive layer, and each of the plurality of wall portions is disposed between adjacent light control parts of the plurality of light control parts in a plan view.

8. The display module of claim 7, wherein the functional layer further comprises a plurality of second light shielding layers disposed between the plurality of wall portions and the heat conductive layer.

9. The display module of claim 1, wherein the heat conductive layer overlaps the plurality of color filters and the plurality of first light shielding layers in a plan view.

10. The display module of claim 9, wherein the heat conductive layer transmits incident light.

11. The display module of claim 1, wherein the heat conductive layer comprises a first heat conductive portion overlapping the display area and a second heat conductive portion overlapping the non-display area.

12. The display module of claim 11, wherein the second heat conductive portion extends from the first heat conductive portion.

13. The display module of claim 11, wherein the second heat conductive portion directly contacts the first heat conductive portion.

14. The display module of claim 11, wherein the second heat conductive portion is bent so that at least one portion is disposed below the display panel.

15. The display module of claim 1, wherein the heat conductive layer directly contacts the plurality of light control parts.

16. The display module of claim 1, wherein at least one portion of the heat conductive layer has an uneven shape.

17. The display module of claim 1, further comprising a capping layer overlapped with the heat conductive layer in a plan view.

* * * * *